United States Patent
Barot

(10) Patent No.: US 7,821,118 B1
(45) Date of Patent: Oct. 26, 2010

(54) POWER DISTRIBUTION PATTERN FOR A BALL GRID ARRAY

(75) Inventor: Nitinkumar Barot, San Jose, CA (US)

(73) Assignee: Atheros Communications, Inc., Santa Clara, CA (US)

(*) Notice: Subject to any disclaimer, the term of this patent is extended or adjusted under 35 U.S.C. 154(b) by 0 days.

(21) Appl. No.: 12/352,743

(22) Filed: Jan. 13, 2009

(51) Int. Cl.
*H01L 23/52* (2006.01)

(52) U.S. Cl. .................. 257/691; 257/778; 257/786

(58) Field of Classification Search .............. 257/691, 257/778, 786
See application file for complete search history.

(56) References Cited

U.S. PATENT DOCUMENTS

| | | | | |
|---|---|---|---|---|
| 5,801,440 A | * | 9/1998 | Chu et al. | 257/691 |
| 6,137,168 A | * | 10/2000 | Kirkman | 257/691 |
| 6,476,472 B1 | * | 11/2002 | Davison et al. | 257/678 |
| 2004/0238939 A1 | * | 12/2004 | Wu | 257/691 |

* cited by examiner

*Primary Examiner*—S. V Clark

(57) ABSTRACT

A reduced inductance power distribution pattern for an integrated circuit (IC) package is disclosed. The IC package can include a die in which the electronic circuitry is formed, a ball grid array (BGA) substrate, and a plurality of conductive balls coupled to the BGA substrate. The IC package can further include a plurality of conductive trace rings routed in parallel, and a plurality of bond wires for coupling the die to the conductive balls via the conductive trace rings.

20 Claims, 4 Drawing Sheets

POWER DISTRIBUTION PATTERN FOR A BALL GRID ARRAY

FIELD

The present disclosure relates generally to integrated circuits. More specifically, the present disclosure is related to power distribution in an integrated circuit package.

BACKGROUND

In integrated circuit (IC) packaging, a ball grid array (BGA) has become one of the most popular packaging alternatives for input/output (I/O) devices in the industry. The electric coupling of an IC package to a power supply can be modeled as a resistance-inductance-capacitance circuit. A power supply loop circuit is formed from a series of conductive paths from a terminal of the power supply to the IC package and back from the IC package to the terminal of the power supply. An electrical characteristic of these conductors (e.g., resistance, capacitance and inductance) may be determined by the impedance of the loop circuit. Further, long bond wires determine the total impedance, conductance, and inductance of the connection. Hence, long bond wires may create a larger loop circuit for current paths, thereby increasing the inductance.

Typically, an integrated circuit package consists of a BGA substrate with two layers, an array of conductive balls, and a die mounted on the BGA substrate. In general, two-layer BGA substrates require long bond wires to couple power from the conductive balls to the die. Long bond wires often result in high-levels of stray inductance, further leading to a poor transmitted error vector magnitude (EVM). EVM is commonly used to quantify the performance of a digital radio transmitter or receiver. Hence, poor EVM may indicate reduced performance, reduced sensitivity, and negatively affected wireless signals.

One approach to solve the problem of poor EVM in a conventional two-layer BGA substrate is the inclusion of additional layers. This multi-layer design effectively stacks layers on top of each other to provide additional regions that may carry signals or power and may reduce the length of bond wires. Multi-layer BGA substrates therefore improve EVM performance by isolating conductive elements and reducing the need for long bond wires. However, the fabrication of multi-layer BGA substrates is relatively expensive in comparison to conventional two-layer designs. As a result, the solution offered by multi-layer designs is not ideal for most applications.

In addition, a well designed power distribution pattern is required for an IC package to provide a regulated power supply voltage over a wide range of frequencies. Unfortunately, even well designed power distribution patterns exhibit non-uniform impedance as a function of frequency. As high performance IC packages demand larger currents at higher frequencies with lower power supply voltages, power system design becomes increasingly more challenging. Accordingly, reductions in the impedance of the power distribution pattern, particularly inductive components are desired.

In the light of the foregoing discussion, there is a need for a lower-cost, lower-inductance, package design with improved EVM performance. Current designs are plagued with operational problems, especially when used in wireless applications over a wide range of frequencies. And given the current limitations on fabrication technology, multi-layer substrates are not cost-effective replacements for two-layer substrates.

SUMMARY

Accordingly, it is an object of the present invention to provide an integrated circuit (IC) package that can improve the error vector magnitude (EVM) of a BGA package while controlling costs.

Further, it is an object of the present invention to provide an integrated circuit (IC) package that can reduce the inductance of a BGA package irrespective of the operational frequency.

The above and other objects of the present invention are achieved by providing a reduced inductance power distribution pattern for an IC package. The IC package can include a die in which the electronic circuitry is formed, a BGA substrate, and a plurality of conductive balls coupled to the BGA substrate. The IC package further includes a plurality of conductive trace rings routed in parallel, and a plurality of bond wires for coupling the die to the conductive balls via the conductive trace rings.

Other features and advantages of the present invention will become apparent from the following description of the various embodiments of the present invention, taken in conjunction with the accompanying drawings, which illustrate, by way of example, the principles of the invention, the invention not being limited to any particular embodiment(s) disclosed.

BRIEF DESCRIPTION OF THE DRAWINGS

The above, and other embodiments of the present invention, may be more fully understood from the following detailed description taken together with the accompanying drawing wherein similar reference characters refer to similar elements and in which.

Figure 1:
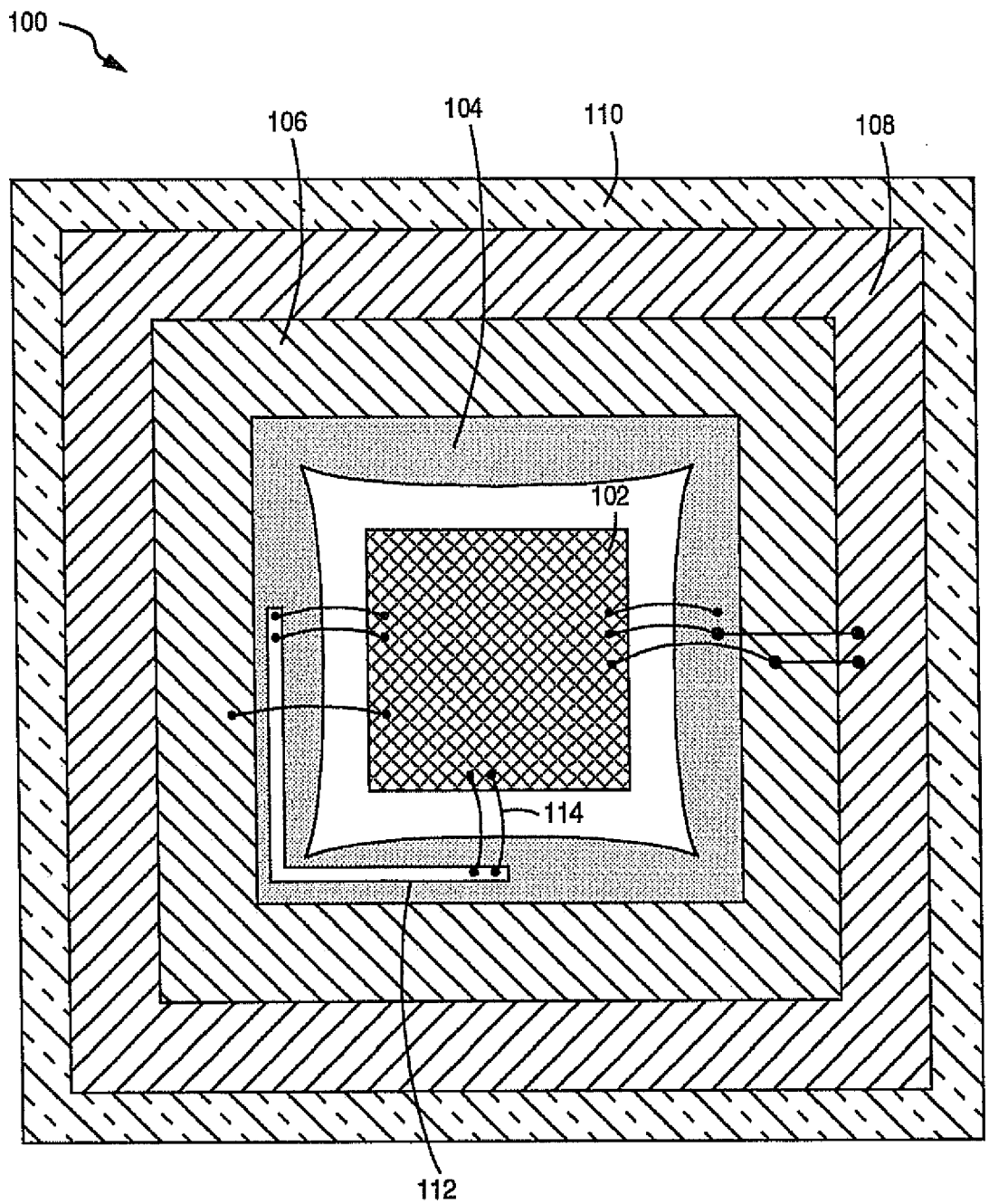
FIG. 1 illustrates a conventional ball grid array (BGA) substrate, depicting a conventional arrangement for power distribution in the conventional BGA substrate.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

System components have been represented where appropriate by conventional symbols in the drawings, showing only those specific details that are pertinent to understanding the present disclosure so as not to obscure the disclosure with details that will be readily apparent to those of ordinary skill in the art having the benefit of the description herein.

In this document, relational terms such as "first" and "second" and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . .

. a" does not, without more constraints, preclude the existence of additional identical elements in the process, method, article, or apparatus that comprises the element.

FIG. 1 illustrates a conventional BGA package 100, depicting a conventional arrangement for power distribution. The conventional BGA package 100 includes a die region 102, a ring region 104, a finger region 106, a ball region 108, and a clearance region 110. Further, the conventional BGA package 100 includes a plurality of conductive traces 112, connecting a plurality of bond wires 114 to a die mounted on the die region 102. Typically, a plurality of conductive balls (not shown) is located in (underneath) the die region 102 and the ball region 108. The ring region 104 and the finger region 106 are the areas on the conventional BGA package 100 that support the conductive traces (e.g., conductive trace 112). The conductive traces provide electric connectivity paths within the conventional BGA package 100. Areas in the ring region 104 and the finger region 106 receive the bond wires 114 from the die to couple a signal to the conductive balls, typically using the conductive traces.

The ring region 104 supports the conductive traces 112 to distribute power. Some of the balls located in the die region 102 provide a ground reference signal.

Figure 2:
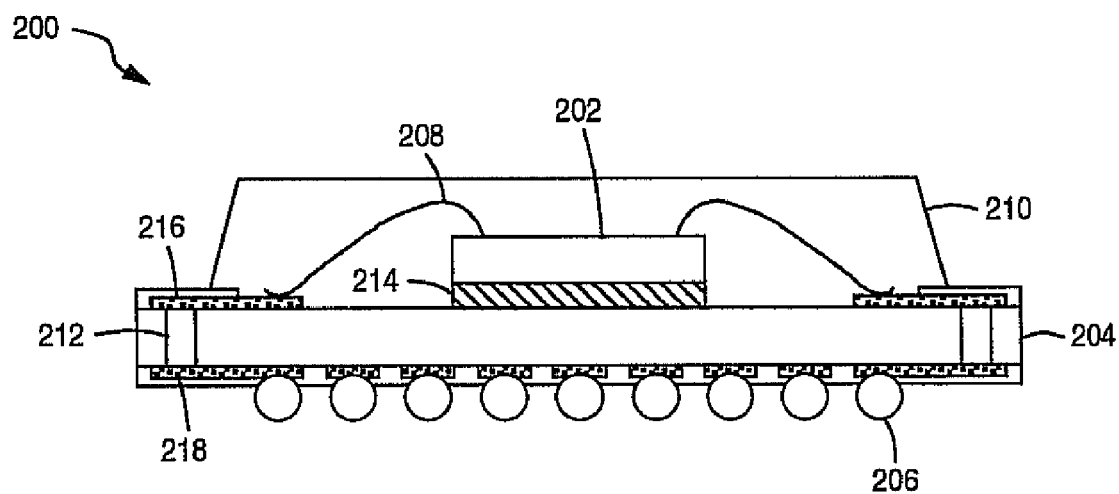
FIG. 2 illustrates an integrated circuit (IC) package, in accordance with an embodiment of the present invention.

FIG. 2 illustrates, in cross-section, an example of an IC package 200, in accordance with an embodiment of the present invention. The IC package 200 includes a die 202 having electronic circuitry, a two-layer BGA substrate 204, a plurality of conductive balls 206, a plurality of bond wires 208, and a molding compound 210. The IC package 200 consists of a bismaleimide triazine (BT) laminate substrate, for example, with at least two metal layers and interconnected vias 212. The die 202 can be mounted on the top of the BGA substrate 204 using a metal die attach pad 214. The die 202 can be coupled to the BGA substrate 204 using the bond wires 208. The bond wires 208 extend from bonding pads (not shown) on the die 202 to a first array of pads 216 on the upper surface of the BGA substrate 204. The interconnected vias 212 extend from the first array of pads 216, through the BGA substrate 204, to a second array of pads 218 on the lower surface of the BGA substrate 204. The conductive balls 206 are coupled to the second array of pads 218 at the lower surface of the BGA substrate 204. In this manner, the conductive balls 206 are electrically connected to the die 202. Further, the die 202 along with the plurality of bond wires 208 is protected by the molding compound 210.

Figure 3:
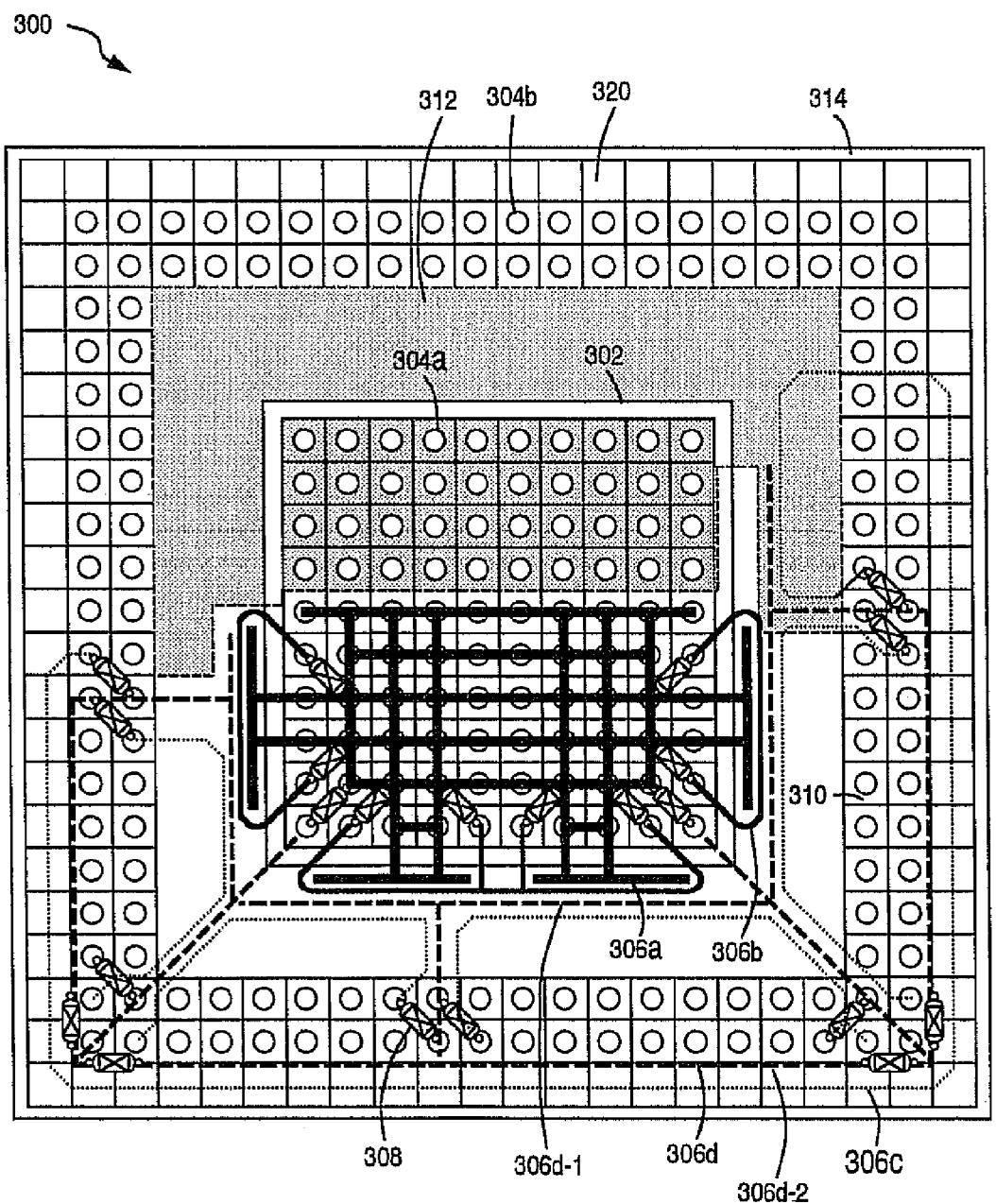
FIG. 3 illustrates a BGA package, in accordance with an embodiment of the present invention.

FIG. 3 illustrates elements of a BGA package 300, in accordance with an embodiment of the present invention. FIG. 3 is viewed from a perspective orthogonal to that of FIG. 2; for example, FIG. 3 may illustrate a top-down view with respect to the orientation of FIG. 2.

The BGA package 300 includes a plurality of regions (or sets) of conductive balls such as sets 304a and 304b, and a plurality of conductive trace rings such as trace rings 306a, 306b, 306c, and 306d (306a-d). The die region 302 is for mounting a die in which electronic circuitry has been formed. In such an embodiment, at least some of the conductive trace rings 306a-d are arranged at least in part within the boundaries of the die region 302 on one layer of the two-layer BGA substrate 204 (FIG. 2). That is, the die may be separated from conductive traces within the die region 302 by an interposing layer (not shown).

Figure 4:
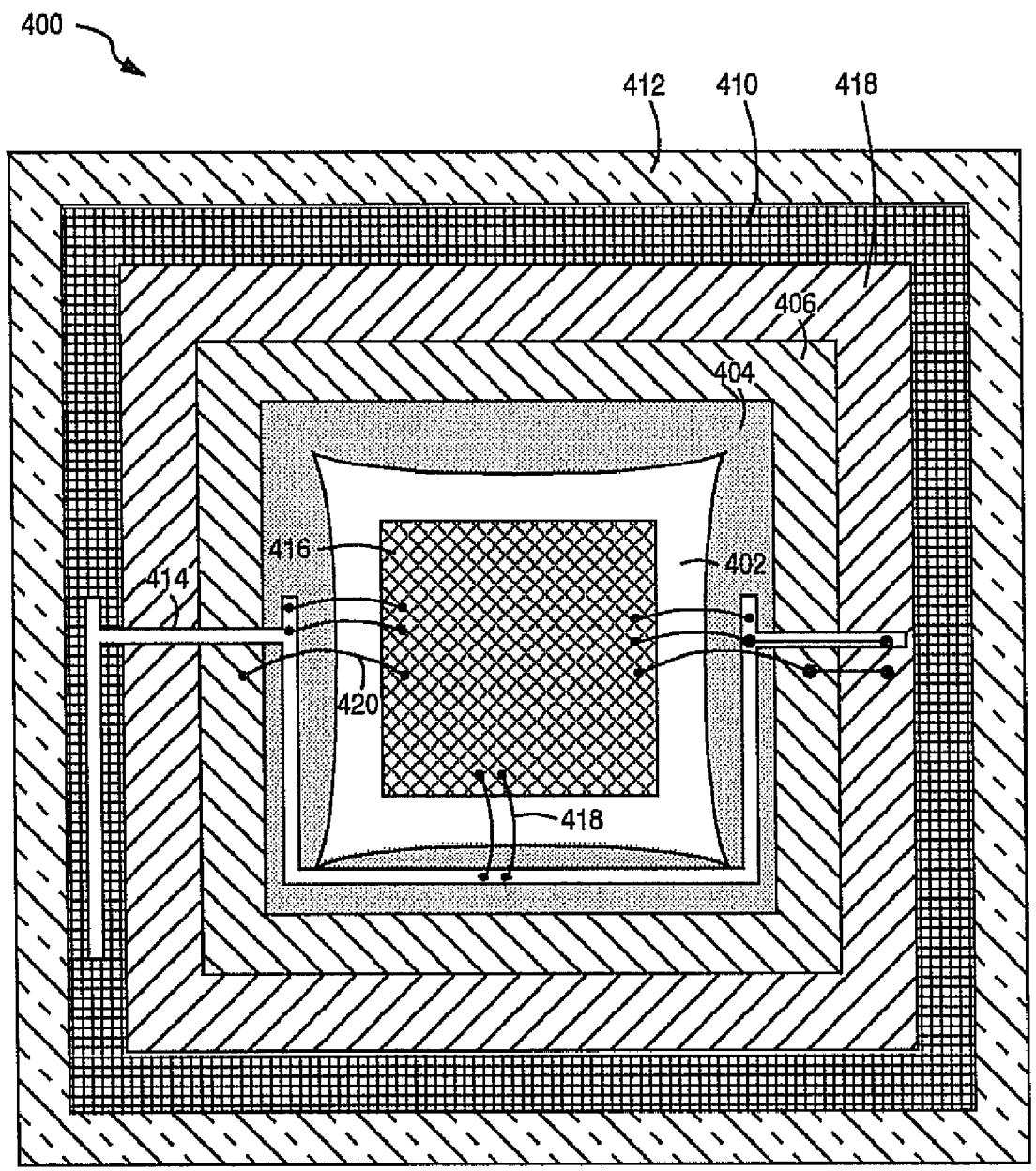
FIG. 4 illustrates a BGA package, in accordance with another embodiment of the present invention.

In one embodiment, the die is connected to the BGA package 300 through a plurality of bond wires (not shown in FIG. 3; refer to FIG. 4). More specifically, the bond wires couple the die to each conductive trace ring 306a-d, which in one embodiment are in turn coupled to the conductive balls as described in conjunction with FIG. 2.

In the example of FIG. 3, the die region 302 encompasses the first set 304a of conductive balls. The first set 304a of conductive balls is capable of distributing power signals to the die on the IC package where it is placed. According to an embodiment, at least one conductive ball of the first set of conductive balls 304a distributes power to the die. The distribution of power by at least one conductive ball of the first set 304a of conductive balls is facilitated by at least one of the conductive trace rings 306a-d (specifically, trace ring 306b). In one embodiment, the number of conductive balls in the first set 304a of conductive balls assigned to distribute power to the die is ten (two other conductive balls in the first set 304a distribute power to the I/O pads via trace ring 306c).

Furthermore, at least one conductive ball of the first set 304a of conductive balls provides a digital ground for the die. The digital ground provided by the first set of conductive balls 304a is facilitated by at least one of the conductive trace rings 306a-d (specifically, trace ring 306a). In one embodiment, fifty conductive balls in the first set 304a of conductive balls provide the digital ground for the die.

In addition, the BGA package 300 includes a ball region 310 that includes the second set 304b of conductive balls. In one embodiment, at least one conductive ball of the second set 304b of conductive balls is capable of distributing power for the input/output (I/O) pads. The second set 304b of conductive balls receives the I/O signals through at least one of the conductive trace rings 306a-d (specifically, trace ring 306c). Additionally, at least one of the trace rings 306a-d extends beyond the outermost perimeter of the ball region 310. In yet another embodiment, the number of conductive balls of the second set 304b of conductive balls assigned to receive the I/O signals is in the range of 1-500, and more precisely, ten (plus two more conductive balls from the first set 304a of conductive balls).

Furthermore, at least one conductive ball of the second set 304b of conductive balls provides a digital ground for the I/O pads. The digital ground provided by the second set of conductive balls 304a is facilitated by at least one of the conductive trace rings 306a-d (specifically, trace ring 306d). In one embodiment, twelve conductive balls in the second set 304b of conductive balls provide the digital ground for the I/O pads.

In the example of FIG. 3, the BGA package 300 also includes a plane layer bounded in a region 312. In one embodiment, the region 312 depicts an analog ground plane layer to provide an analog VSS (AVSS) ground for the die. In such an embodiment, the region 312 provides an analog ground for the die in the inner region of the BGA package 300 through forty conductive balls of the first set 304a of conductive balls. The analog ground plane layer may be a copper layer.

In the example of FIG. 3, there are 120 conductive balls in the second set 304b that are not assigned as described above and that are available for peripheral signals.

Furthermore, the BGA package 300 includes a clearance region 314. The clearance region 314 extends to the outermost perimeter of the BGA package 300 and contains no conductive elements.

The conductive trace rings 306a-d are routed in parallel to each other on one layer of the two-layer BGA substrate 204 (FIG. 2)—that is, the conductive trace rings 306a-d are parallel to each other in the sense that they do not intersect each other or cross over each other. The conductive trace rings 306a-d are also parallel to each other in the sense that they perform their respective functions (which are described below) separately from one another. The widths of the conductive trace rings 306a-d are a design choice. In one embodiment, the width of each conductive trace ring is in the range of about 75-100 microns. The trace rings are, in general, wider at points where bonding occurs and narrower between those points.

In one embodiment, the conductive trace ring 306a provides a digital VSS (DVSS) ground for the die. VSS is the power supply for the negative rail of a circuit. In the present embodiment, the conductive trace ring 306a distributes power signals in the inner region of the BGA package 300 through the first set 304a of conductive balls. In one such embodiment, fifty conductive balls in the first set 304a are assigned to the conductive trace ring 306a for the purpose just mentioned.

The conductive trace ring 306b provides digital VDD (DVDD) signals for distributing power to the die. VDD is the power supply for the positive rail of the circuit. In the present embodiment, the conductive trace ring 306b provides a lower voltage (e.g., 1.2V) power supply. In one such embodiment, the conductive trace ring 306b distributes power signals to the die in the inner region of the BGA package 300 through eight conductive balls in the first set 304a of conductive balls. In contrast to conventional BGA packages, the conductive balls associated with the VDD power supply are located both closer to the die and closer to each other. Accordingly, relative to conventional designs, the conductive trace ring 304b is shorter, which reduces the trace inductance.

Portions of both of the conductive trace rings 306a and 306b extend beyond the perimeter of the die region 302, facilitating the connection of those trace rings to the die itself via relatively short bond wires. The use of shorter bond wires reduces the associated inductance.

The conductive trace ring 306c provides a DVSS ground for I/O signals. In the present embodiment, the conductive trace ring 306c provides a power supply ground signal for an I/O pad through the second set 304b of conductive balls. In such an embodiment, a total of twelve conductive balls of the second set of conductive balls 304b are assigned to provide power supply ground signals for the pads. Also, portions of the conductive trace ring 306c are routed outside the region 310, into and through the region 320 that is between the conductive ball region 310 and the clearance region 314.

The conductive trace ring 306d is a DVDD for distributing a higher voltage (e.g., 3.3V) power supply to the I/O pads. The conductive trace ring 306d extends from the inner region of conductive balls to the outer region of conductive balls the BGA package 300. That is, the conductive trace ring 306d is connected to selected conductive balls (e.g., two conductive balls) in the first set 304a and also to selected conductive balls (e.g., ten conductive balls) in the second set 304b Accordingly, in one embodiment, the conductive trace ring 306d distributes power signals through twelve conductive balls.

Also, the conductive trace ring 306d includes, in essence, two "wings" for the I/O power supply—a first bus portion 306d-1 that passes inside the set 304b of conductive balls, and a second bus portion 306d-2 that passes outside of the set 304b and is parallel to the first bus portion. The net effect of the parallel arrangement of the two primary bus portions is to reduce inductance.

In another embodiment, assignment of the lower voltage and higher voltage can be reversed, such that the lower voltage is assigned to the conductive trace ring 306d and the lower voltage is assigned to the conductive trace ring 306b.

In general, according to embodiments of the invention, there are multiple power domains; in the example of FIG. 3, there are four such domains, referred to herein as: 1) the DVSS power supply ground domain ("first domain") for the die, to which 50 conductive balls in the inner region (set 304a) are assigned; 2) the low voltage (e.g., 1.2V) DVDD power supply domain ("second domain") for the die, to which eight conductive balls in the inner region (set 304a) are assigned; 3) the DVSS power supply ground domain ("third domain") for the I/O pads, to which twelve conductive balls in the outer region (set 304b) are assigned; and 4) the high voltage (e.g., 3.3V) power supply domain ("fourth domain") for the I/O pads, to which twelve conductive balls (two from the inner region, set 304a, and ten from the outer region, set 304b) are assigned. Conductive balls assigned to one power domain are not assigned to another power domain—each power domain includes a mutually exclusive subset of conductive balls.

Furthermore, each power domain is connected in parallel to a respective conductive trace ring 306a, 306b, 306c or 306d. In the example of FIG. 3, conductive trace ring 306a is connected to the conductive balls that constitute the first domain; conductive trace ring 306b is connected to the conductive balls that constitute the second domain; conductive trace ring 306c is connected to the conductive balls that constitute the third domain; and conductive trace ring 306d is connected to the conductive balls that constitute the fourth domain. Significantly, the conductive balls assigned to each of the aforementioned power domains are selected such that the routing of the conductive trace rings 306a-d can be accomplished in a single layer. That is, the conductive trace rings 30a-d do not cross over or other overlap one another.

Thus, the power domains, in particular the power domains for the die, can be situated in the centralized region of the BGA package (e.g., in the region 302). Consequently, shorter bond wires can be used to connect the power domains to the die itself.

In one embodiment, in the assembled package, decoupling capacitors (e.g., decoupling capacitor 308) are used to decouple the conductive trace rings 306a-d from one another. As shown in the example of FIG. 3, a decoupling capacitor is located where the conductive traces rings are proximate to one another. Thus, the conductive balls used in each of the power domains, as well as the conductive traces associated with each power domain, can be localized in a particular region of the BGA package.

In the example of FIG. 3, the power domains are located in the "lower" portion of the BGA package 300 (considering the orientation of FIG. 3). In general, this type of arrangement is useful for connecting to a die for a single-chip mixed-signal (analog radio frequency [RF] signals and digital signals) device such as those used in wireless transmitters and receivers. According to embodiments of the invention, connections to the digital circuitry can be localized as illustrated in FIG. 3, leaving the "upper" portion (the conductive balls in the region 312) of the BGA package available for connections to the analog (RF) circuitry.

FIG. 4 illustrates a BGA package 400 in accordance with another embodiment of the present invention. In this embodiment, the BGA package 400 includes a first region 402, a second region 404, a third region 406, a fourth region 408, a fifth region 410, a sixth region 412 and a plurality of conductive trace rings such as conductive trace ring 414. The conductive trace rings are capable of distributing power to the die 416. The plurality of conductive trace rings are routed in parallel to each other on one layer of the two-layer BGA substrate 204 (FIG. 2). The conductive trace ring 414 is analogous to a conductive trace ring 306a, 306b, 306c or 306d of FIG. 3.

A die 416 in which an electronic circuitry is formed is mounted on the first region 402 of FIG. 4. The first region 402 includes a first set of conductive balls that are capable of distributing power signals to the die. In one embodiment, the first region 402 corresponds to the die region 302 of FIG. 3. In one embodiment, the number of conductive balls in the first region 402 is one hundred. In one embodiment, the number of conductive balls in the first region 402 that are assigned to distribute power to the die 416 is eight. Further, the number of conductive balls in the first region that are assigned to provide the digital ground signal to the die 416 is fifty. Two of the conductive balls in the first region 402 distribute power to the I/O pads (in combination with ten conductive balls in the fourth region 408). Other conductive balls in the first region 402 provide an analog ground signal to the die 416.

The second region 404 of FIG. 4 distributes power to the die 416 through a first plurality of bond wires 418 coupled to the conductive trace ring 414. The second region 404 has its innermost perimeter adjacent to the outermost perimeter of the first region 402.

The third region 406 distributes a plurality of signals to the die 416 through a second plurality of bond wires 420 coupled to another conductive trace ring (not shown in FIG. 4). The third region 406 has its innermost perimeter adjacent to the outermost perimeter of the second region 404.

The fourth region 408 has a second set of conductive balls. In one embodiment, the fourth region 408 corresponds to the region 310 of FIG. 3. In one such embodiment, a subset of the second set of conductive balls receives I/O signals. The second set of conductive balls receives the I/O signals through a third conductive trace ring (not shown in FIG. 4). In the present embodiment, the number of conductive balls of the second set of conductive balls assigned to receive the I/O signals is twelve, and the number of conductive balls of the second set of conductive balls assigned to distribute power to the die 416 is ten. Other conductive balls of the second set of conductive balls are assigned to distribute a plurality of peripheral signals. The fourth region has its innermost perimeter adjacent to the outermost perimeter of the third region 406.

The fifth region 410 extends at least one conductive trace ring of the plurality of conductive trace rings 414 beyond the outermost perimeter of the fourth region 408. The fifth region 410 has its innermost perimeter adjacent to the outermost perimeter of the fourth region 408.

The sixth region 412 provides the physical clearance between the fifth region 410 and the outermost perimeter of the BGA package 400. The sixth region 412 has its innermost perimeter adjacent to the outermost perimeter of the fifth region 410.

In one embodiment, at least one conductive ball of the first set of conductive balls provides a digital ground signal to the die 416. The distribution of the digital ground signal by the first set of conductive balls is managed in conjunction with at least one conductive trace ring (e.g., conductive trace ring 306a of FIG. 3). Further, at least one conductive ball of the first set of conductive balls distributes power to the die 416. The distribution of power by the first set of conductive balls is facilitated by at least one conductive trace ring (e.g., conductive trace ring 306b of FIG. 3).

In another embodiment, approximately one-half of the first set of conductive balls are used for distributing power to the die 416. The remaining one-half of the first set of conductive balls are used for providing a digital ground signal to the die.

In yet another embodiment, the conductive trace rings are arranged within the boundaries of the die region 402 on at least one layer of a two-layer BGA substrate 204 (FIG. 2). The arrangement of the conductive trace rings around the boundaries of the various regions allows for parallel electrical paths. Since the inductance of elements arranged in parallel is reduced, the parallel arrangement of the conductive trace rings reduces the inductance of the BGA package 400.

In general, FIG. 4 illustrates that power and ground regions are centrally located within the first, second and third regions 402, 404 and 406. More specifically, power and grounding for the die 416 is provided by the first and second regions, and power and grounding for the I/O pads is provided by the third region. Consequently, bond wires from the second region to the die, and from the third region to the die, can be shorter than conventional bond wires.

According to embodiments of the invention, the inductance occurring in the conductive trace rings acting as the power lines on an IC package can be substantially reduced. Further, the availability of parallel conductive traces facilitates the reduction in the length of the bond wires. Since longer bond wires increase the stray inductance, shorter bond wires assure the reduction of stray inductance in the IC package. In addition, the conductive trace rings transmitting power and ground signals can be easily routed without any crossovers. This arrangement accomplishes a better designed power distribution pattern for the IC package to provide a well-regulated supply voltage over a wide range of frequencies from a peak frequency, to very low frequencies. Accordingly, the present disclosure greatly improves the operational efficiency and the reliability of the IC package.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

What is claimed is:

1. A ball grid array (BGA) package comprising:
a plurality of conductive balls coupled to a substrate, wherein the conductive balls comprise a first set of conductive balls and a second set of conductive balls different from the first set and forming a perimeter around the first set, wherein the first set comprises conductive balls for supplying power to and for grounding a die in which electronic circuitry is formed; and
a plurality of conductive trace rings routed in parallel in one layer on the substrate, the conductive trace rings coupled to respective and mutually exclusive subsets of the conductive balls, wherein the subsets comprise a first subset of the first set, the first subset useful for supplying power to a die in which electronic circuitry is formed, the first subset coupled to the die via a first conductive trace ring coupled to each conductive ball in the first subset, the first conductive trace ring also coupled to the die via a first bond wire.

2. The BGA package of claim 1 wherein the first set further comprises conductive balls for analog signals.

3. The BGA package of claim 1 wherein the subsets further comprise a second subset of the first set, the second subset useful for grounding the die, the second subset coupled to the die via a second conductive trace ring coupled to each conductive ball in the second subset, the second conductive trace ring also coupled to the die via a second bond wire.

4. The BGA package of claim 3 wherein the subsets further comprise a third subset of the second set, the third subset useful for supplying power to input/output pads of the die, the third subset coupled to the input/output pads via a third conductive trace ring coupled to each conductive ball in the third subset.

5. The BGA package of claim 4 wherein the subsets further comprise a fourth subset of the second set, the fourth subset useful for grounding the input/output pads, the fourth subset coupled to the input/output pads via a fourth conductive trace ring coupled to each conductive ball in the fourth subset.

6. The BGA package of claim 4 wherein the third subset also comprises conductive balls that are in the first set.

7. An integrated circuit (IC) package comprising:
a die in which electronic circuitry is formed;
a substrate;
a ball grid array comprising a plurality of conductive balls coupled to the substrate;
a plurality of conductive trace rings routed in parallel in one layer on the substrate to respective power domains, wherein each of the power domains comprises a mutually exclusive subset of the conductive balls; and
a plurality of bond wires coupling the die to the conductive trace rings.

8. The IC package of claim 7 wherein the substrate comprises a die region for mounting the die, wherein the perimeter of the die region defines a region encompassing a first set of the conductive balls dedicated to digital signals, wherein further the first set comprises a first power domain of the power domains, the first power domain useful for supplying power to the die.

9. The IC package of claim 8 wherein the first set of conductive balls also comprises a second power domain of the power domains, the second power domain useful for grounding the die.

10. The IC package of claim 8 wherein the perimeter of the die region also encompasses a region comprising conductive balls dedicated to analog radio frequency signals.

11. The IC package of claim 8 further comprising a second set of the conductive balls, the second set different from the first set, wherein the second set comprises a third power domain of the power domains, the third power domain useful for supplying power to input/output pads for the IC package.

12. The IC package of claim 11 wherein the third power domain includes conductive balls from both the first set and the second set.

13. The IC package of claim 11 wherein the second set of conductive balls also comprises a fourth power domain of the power domains, the fourth power domain useful for grounding the input/output pads.

14. An integrated circuit (IC) package comprising:
a substrate;
a die in which electronic circuitry is formed, the die coupled to the substrate;
a plurality of conductive balls coupled to said substrate and electrically connected to the die;
a plurality of power domains for providing power to and for grounding the die and for providing power to and for grounding input/output pads of the die, wherein each of the power domains comprises a mutually exclusive subset of the conductive balls; and
a plurality of conductive trace rings routed in parallel in one layer on the substrate, each of the conductive trace rings coupled to a respective power domain of the plurality of power domains, each of the conductive trace rings also coupled to the die via a respective bond wire.

15. The IC package of claim 14 wherein the conductive balls are arranged in an inner first region and an outer second region that forms a perimeter around the inner region.

16. The IC package of claim 15 wherein the inner region comprises a first subset of the conductive balls useful for supplying power to the die.

17. The IC package of claim 16 wherein the inner region further comprises a second subset of the conductive balls useful for grounding the die.

18. The IC package of claim 15 wherein the inner region further comprises a subset of the conductive balls for analog radio frequency signals.

19. The IC package of claim 15 wherein the outer region comprises a third subset of the conductive balls useful for supplying power to the input/output pads.

20. The IC package of claim 19 wherein the outer region further comprises a fourth subset of the conductive balls useful for grounding the input/output pads.

* * * * *